(12) United States Patent
Alter et al.

(10) Patent No.: US 8,227,860 B2
(45) Date of Patent: *Jul. 24, 2012

(54) SYSTEM FOR VERTICAL DMOS WITH SLOTS

(75) Inventors: Martin Alter, Los Altos, CA (US); John Durbin Husher, Los Altos Hills, CA (US)

(73) Assignee: Micrel, Inc., San Jose, CA (US)

( * ) Notice: Subject to any disclaimer, the term of this patent is extended or adjusted under 35 U.S.C. 154(b) by 323 days.

This patent is subject to a terminal disclaimer.

(21) Appl. No.: 12/622,360

(22) Filed: Nov. 19, 2009

(65) Prior Publication Data

US 2010/0065906 A1      Mar. 18, 2010

Related U.S. Application Data

(60) Continuation-in-part of application No. 11/417,457, filed on May 4, 2006, now Pat. No. 7,576,390, which is a division of application No. 10/376,773, filed on Feb. 28, 2003, now Pat. No. 7,087,491.

(51) Int. Cl.
*H01L 29/76* (2006.01)
*H01L 29/94* (2006.01)
*H01L 23/12* (2006.01)
*H01L 31/062* (2006.01)
*H01L 31/113* (2006.01)

(52) U.S. Cl. ......... 257/335; 257/773; 257/329; 257/330

(58) Field of Classification Search ................... 257/335, 257/329, 508, 773, 786, 296, 304, 330, 302, 257/328

See application file for complete search history.

(56) References Cited

U.S. PATENT DOCUMENTS

| | | | |
|---|---|---|---|
| 5,298,781 A | 3/1994 | Cogan et al. | |
| 5,407,844 A | 4/1995 | Smayling et al. | |
| 5,973,360 A | 10/1999 | Tihanyi | |
| 6,211,977 B1 | 4/2001 | Son et al. | |
| 6,211,997 B1 | 4/2001 | Nutt et al. | |
| 6,630,698 B1 | 10/2003 | Deboy et al. | |
| 6,737,323 B2 * | 5/2004 | Mo | 438/270 |
| 6,894,393 B1 * | 5/2005 | Husher | 257/773 |
| 7,227,223 B2 | 6/2007 | Matsuda et al. | |
| 7,576,390 B2 * | 8/2009 | Husher | 257/335 |

* cited by examiner

*Primary Examiner* — Chuong A. Luu

(74) *Attorney, Agent, or Firm* — Sawyer Law Group, P.C.

(57) ABSTRACT

A device for providing a high power, low resistance, efficient vertical DMOS device is disclosed. The device comprises providing a semiconductor substrate with a source body structure thereon. The device further comprises a plurality of slots in the source/body structure and providing a metal within the plurality of slots to form a plurality of structures. A slotted PowerFET array is disclosed. This slotted approach results in a dense PowerFET, a low Ron due to the slotted design, an oxide isolated process without any due extra steps other than the slots, lower capacitance, lower leakage, smaller die, improved heat transfer, improved electro-migration, lower ground resistance, less cross talk, drops the isolation diffusion and the sinker diffusion, mostly low temperature processing and provides double metal with single metal processing. Also disclosed is a method for integrating this vertical DMOS with CMOS, bipolar and BCD to provide an optimized small, efficient die using the buried power buss approach and these technologies.

12 Claims, 11 Drawing Sheets

Slot Metal Connections to Ground, Drain or Sinkers, Buried Power Buss

Standard Vertical DMOS Output Characteristics

Output Characteristics of Slotted Vertical DMOS

Cross Section of Large Area Vertical DMOS Prior to Slots (not to scale)

Cross Section with Oxidized Slots Cutting Large Area Vertical DMOS, and Filled with Poly (or metal)

Slot Metal Connections to Ground, Drain or Sinkers, Buried Power Buss

Edge Connection to Short Source to Body (if required)

Various Array Approaches Showing Ground Strap Location

Approach (A)

Power FET - Large Serpentine Array

Approach (B)

Power FET - Made up Macro Arrays

Possible Slot Depths
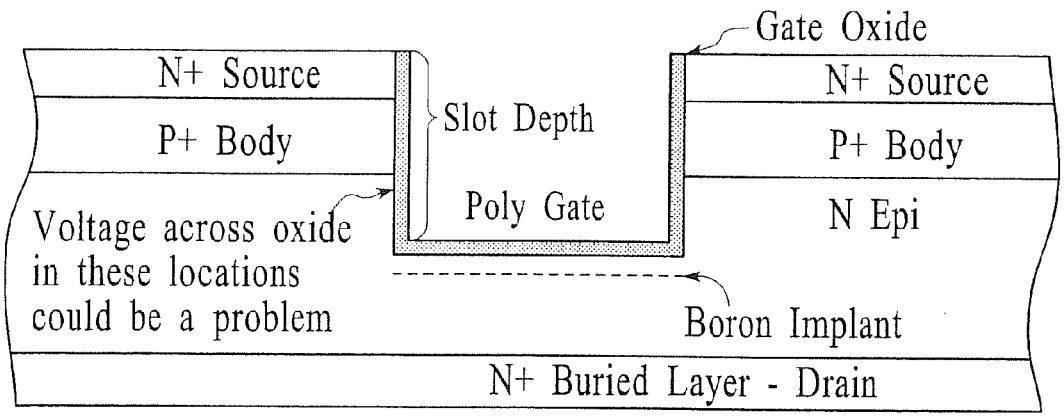
FIG. 10A  Slot into N Epi
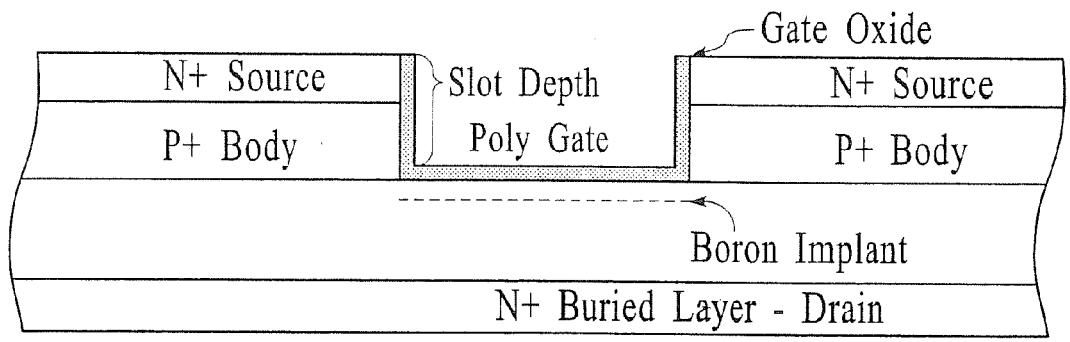
FIG. 10B  Slot through Body to Epi
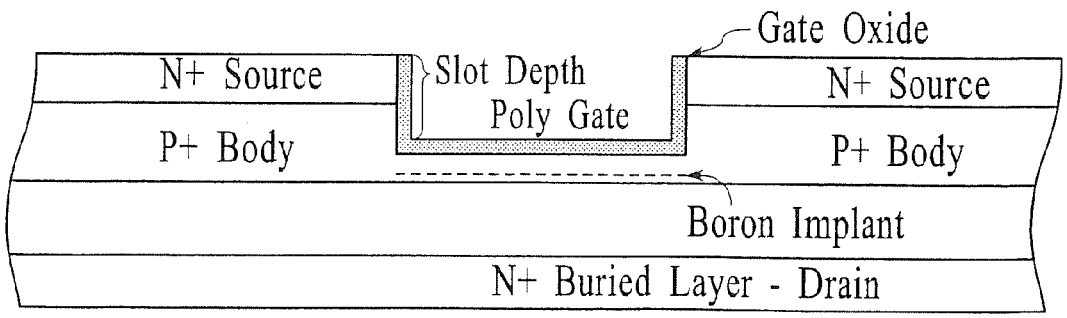
FIG. 10C  Slot into Body

SYSTEM FOR VERTICAL DMOS WITH SLOTS

CROSS-REFERENCES TO RELATED APPLICATIONS

The present application is a continuation-in-part under 35 U.S.C. 120 of patent application Ser. No. 11/417,457 entitled "Method and System for Vertical DMOS with Slots", filed on May 4, 2006 now U.S. Pat. No. 7,576,390, which is a divisional of patent application Ser. No. 10/376,773 entitled "Method and System for Vertical DMOS with Slots", filed Feb. 28, 2003 now U.S. Pat. No. 7,087,491, the contents of each being hereby incorporated by reference.

FIELD OF THE INVENTION

The present invention relates generally to semiconductor devices, and more particularly, to a vertical DMOS device with low Ron X area.

BACKGROUND OF THE INVENTION

FIG. 1 illustrates a cross section view of a conventional Vertical DMOS (VDMOS) device 10. The VDMOS device 10 achieves high drain voltage without rupturing the gate ox in a subtle way. As the drain voltage increases, the depletion regions of adjacent active areas take the highest portion of this voltage as opposed to the gate oxide. This spread out of the depletion region from the adjacent DMOS bodies into the Nwell or N type epitaxial regions absorbs most of the voltage. When the depletion regions merge, no further voltage is applied to the gate oxide.

This approach results in an output transfer curve as shown in FIG. 2. Note that this curve is made up of three sections: (A) linear portion, (B) quasi saturated or pinched-off portion and (C) the saturated portion. Portions A and C are ideal but the B portion represents an unwanted condition. This quasi saturated portion is a high resistance region that is not saturated as the ideal section C represents. This quasi saturated region is the result of current flow down the funnel region 16 shown in FIG. 1 and marked Fet. Current flow down this funnel region 16 results in a pinched-off region (B) forming as the current flow increases, much like a normal FET device. As the current flow increases, it produces a voltage drop which results in a depletion region which tends to pinch off this funnel. This pinched-off region increases until it completely pinches off and represents the saturated condition. This results in the increase in resistance of the funnel region 16.

Accordingly, what is needed is a device that overcomes the above-identified problems. The present invention addresses such a need.

SUMMARY OF THE INVENTION

A device for providing a vertical DMOS device is disclosed. The device comprises a semiconductor substrate with a source body structure thereon. The device further comprises a plurality of slots in the source/body structure and providing a metal within the plurality of slots to form a plurality of structures.

This slotted approach results in a dense vertical DMOS device with a low Ron due to the slotted design, an oxide isolated process without any extra steps other than the slots, a lower capacitance, a lower leakage, a smaller die, an improved higher heat transfer, an improved electro-migration, a lower ground resistance and less cross talk. Meanwhile, it eliminates the isolation diffusion and the sinker diffusion with mostly low temperature processing and provides double metal with single metal processing.

BRIEF DESCRIPTION OF THE DRAWINGS

FIG. 10A shows the body above the poly slot.

FIG. 10B shows the body even with the poly slot.

FIG. 10C shows the body below the poly slot.

DETAILED DESCRIPTION

The present invention relates generally to semiconductor devices and more particularly to a vertical DMOS device with a low Ron X area product. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 2:
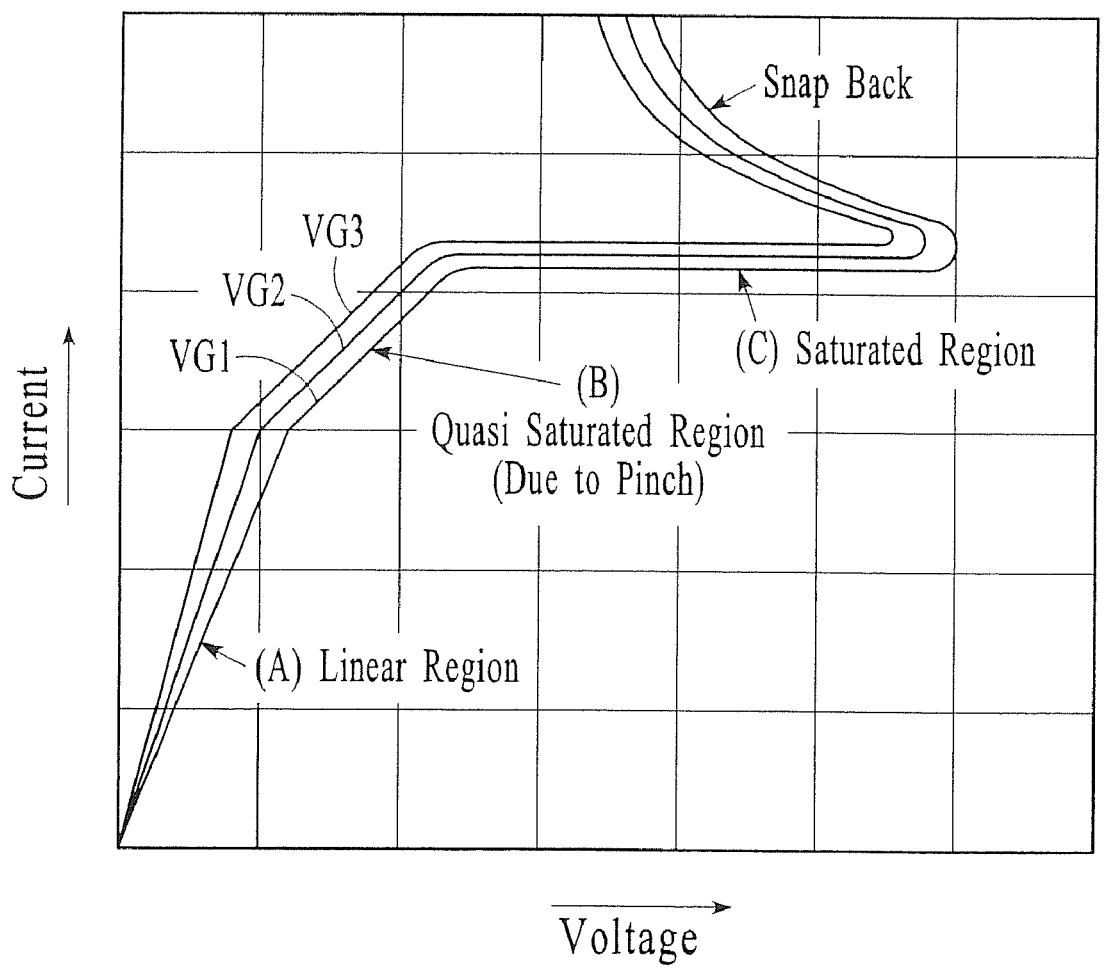
FIG. 2 illustrates an output transfer curve.
Figure 3:
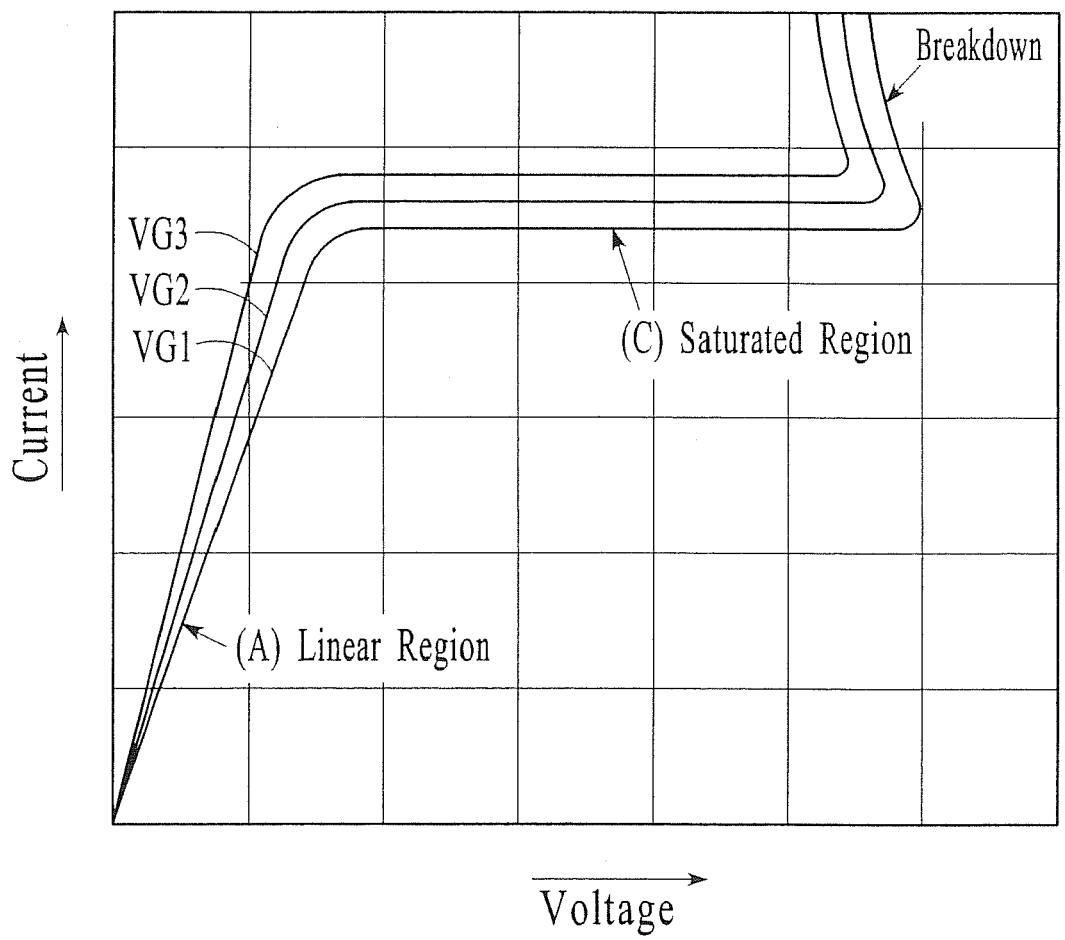
FIG. 3 illustrates a more ideal output transfer curve.

A system and method in accordance with the present invention provides for a Vertical DMOS device in which the pinch off region is eliminated and the quasi saturated region. This results in a more ideal output curve as shown in FIG. 3. In addition to elimination of the quasi saturation region, the approach uses a buried power buss to provide a lower resistance in the linear portion of the curve which is ideal for switching applications. This approach also eliminates the snap back condition shown in FIG. 2. The curve, shown in FIG. 3, results in a normal breakdown voltage rather than the snapback and therefore provides a broader use, high voltage, higher sustaining current device. There are other major advantages to the approach to be shown and they will be detailed as a conclusion.

In the process described, the general steps taken by the industry in standard epitaxial vertical DMOS are used when proceeding through the cross-section makeup of the STI process. However, in this approach the buried power buss approach described in U.S. patent application Ser. No. 10/034,184, entitled "Buried Power Buss for High Current, High Power Semiconductor Devices and a Method for Providing the Same" and filed on Dec. 28, 2001, includes slots processed at the end of the total process. The slots are oxidized, filled with metal, coated with a dielectric and then receive the standard metal and interconnect mask. Many steps of the standard vertical DMOS and BICMOS are eliminated to simplify the total process. This patent application approach provides additional unique advantages over the conventional approach.

Figure 4:
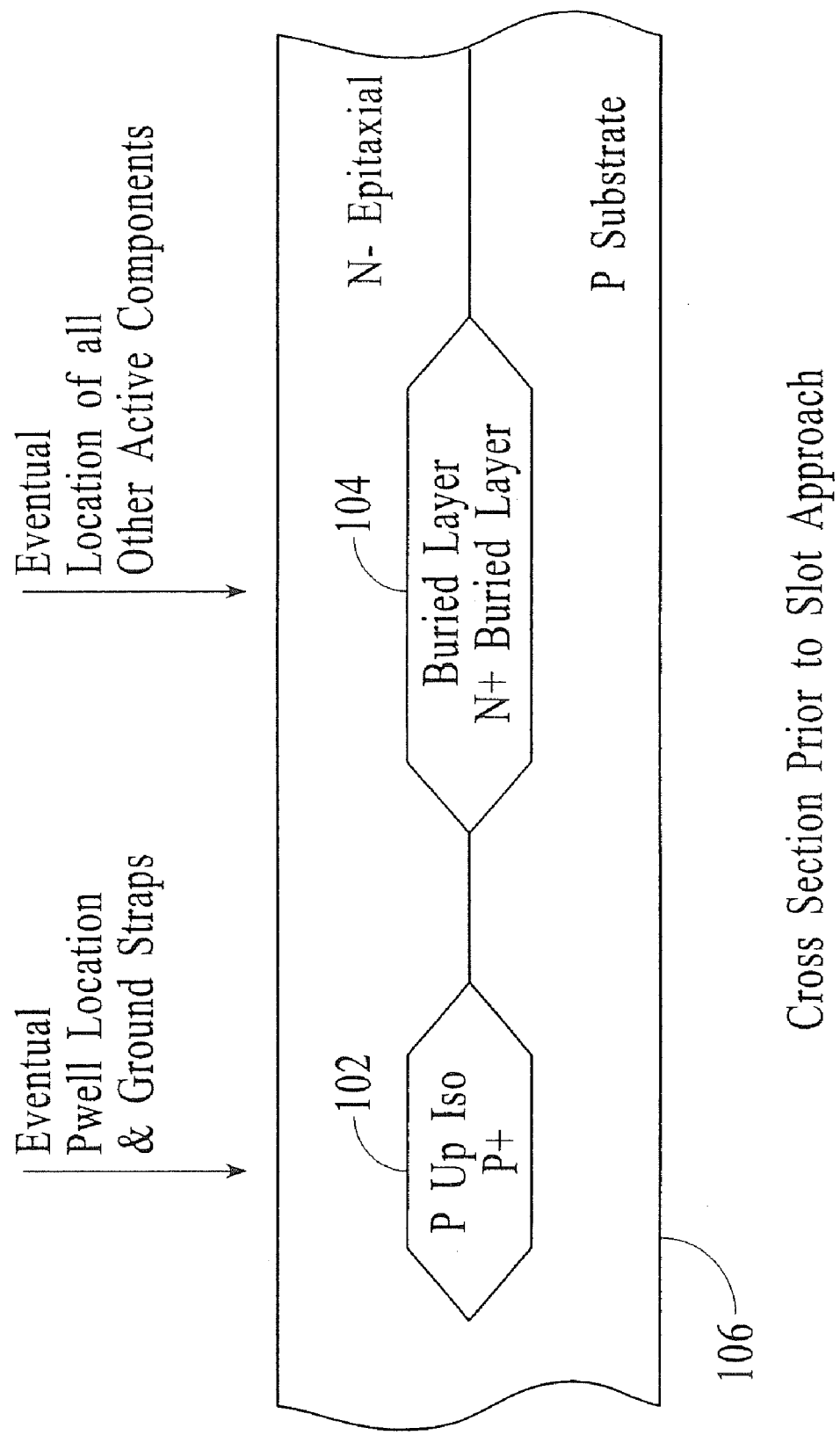
FIG. 4 illustrates a buried layer and epitaxial layer in a P substrate for this approach.
Figure 5:
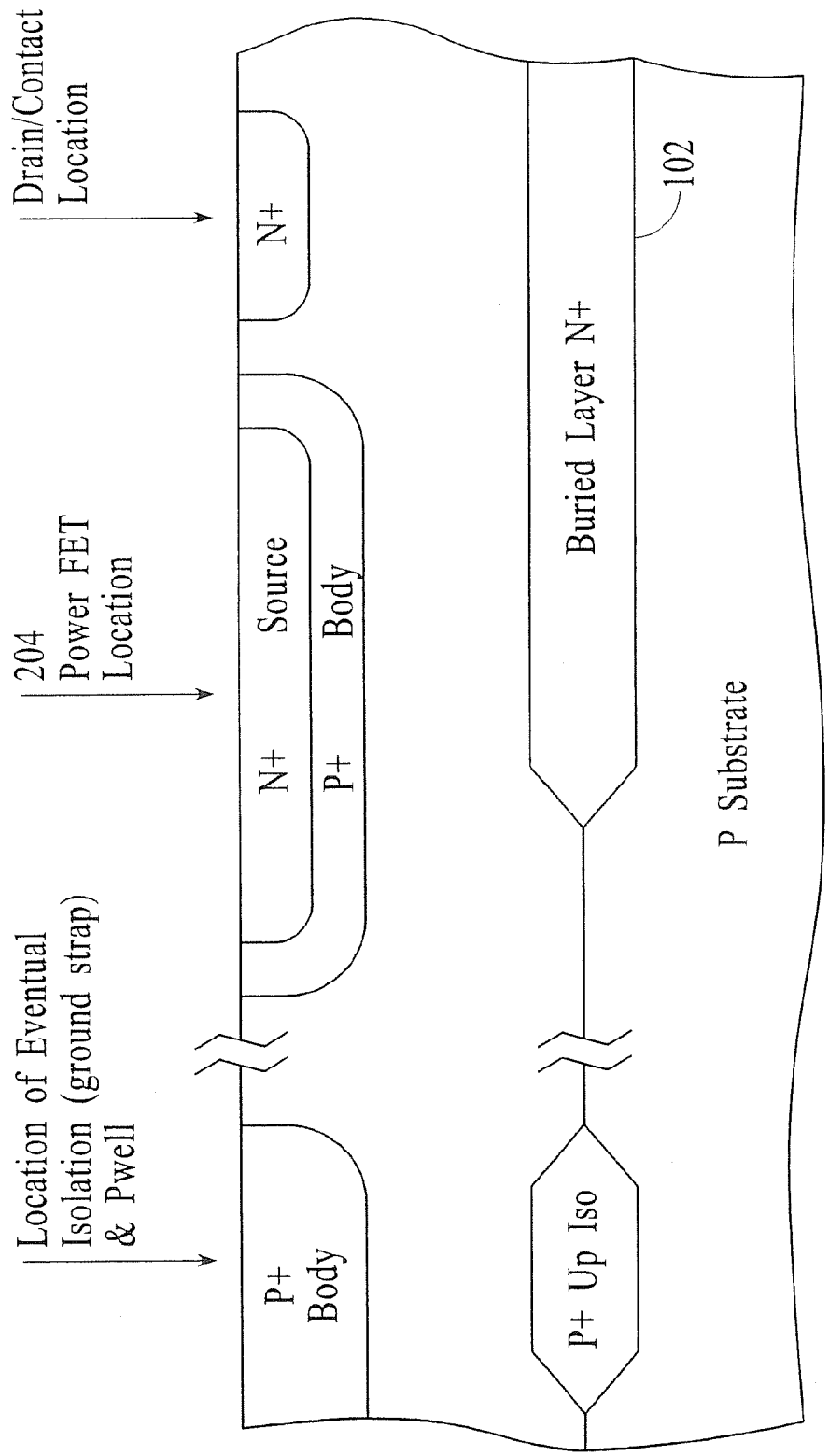
FIG. 5 illustrates the large area body and source formed over the buried layer as the beginning step for this approach.
Figure 6:
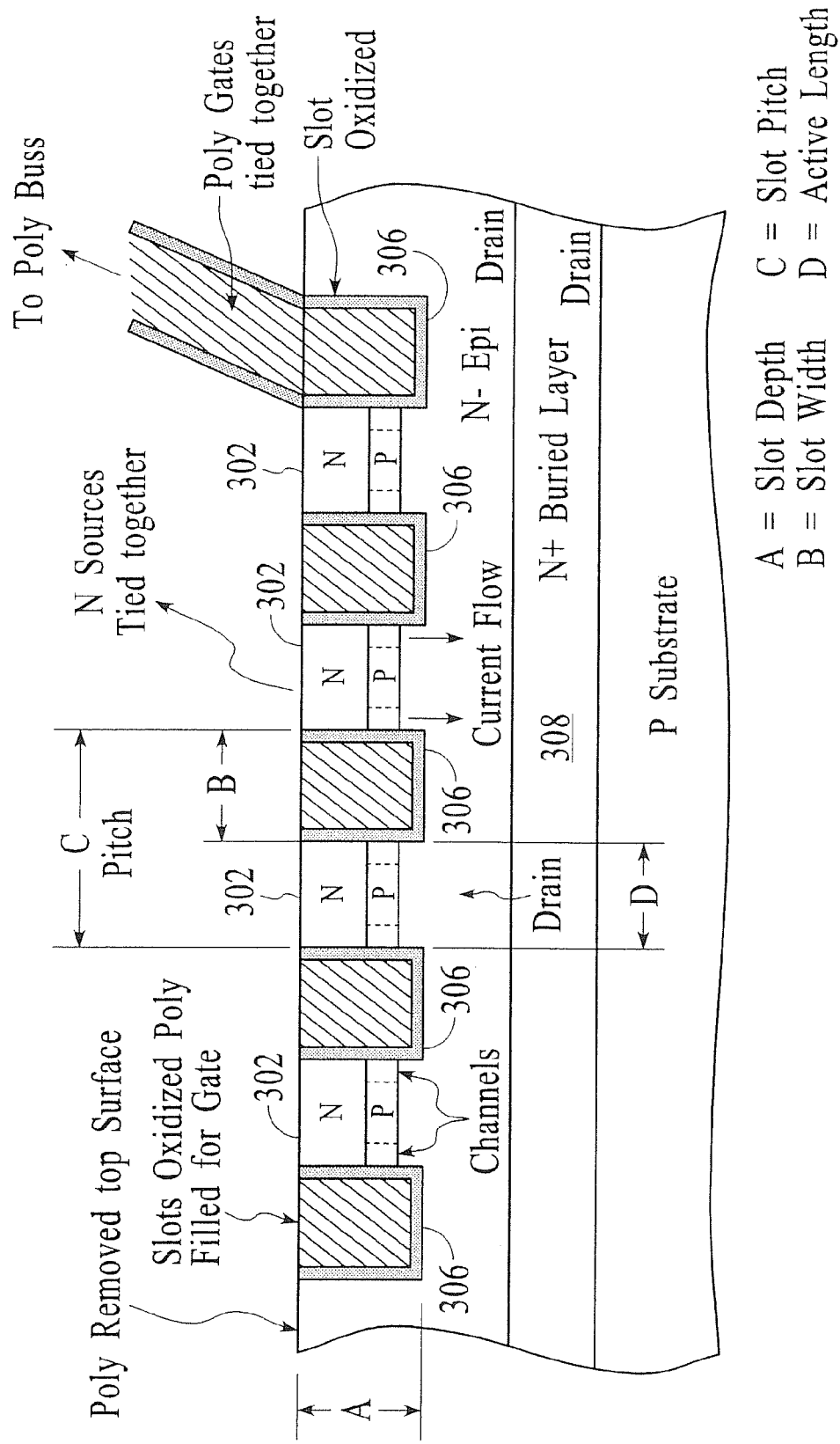
FIG. 6 illustrates the divided regions in the source/body region.

FIG. 4 illustrates a buried layer 102 and epitaxial layer 104 in a P substrate 100. However, the isolation diffusion is eliminated and a large area body and source is formed. FIG. 5 illustrates the large area body and source 204 formed over the buried layer 102. This large body/source 204 represents an area that will be subdivided into many smaller source/body regions 302 by the use of slots. FIG. 6 illustrates the divided regions 302 in the source/body region 204. These slots 306 are separated into, for example, 3 um by 3 um deep slots (dimension A is the slot depth of 3 um in this example). The slot width is, for example, the 3 um dimension B shown in the figure. The space between the slots, dimension D, is the active source/body and is 3 um in this example. The total dimension from slot to slot (dimension C) is the pitch of the array and is 6 um in this example. The total width of the active area is the dimension going into the paper in FIG. 6 and is as wide as the design requires since it determines the Ron and Ids current and eventually the size of the total array. The larger size is used for power applications requiring high current, low Ron resistance, and low voltage drop in the active device.

The slots are oxidized and may be filled with poly, or metal which will represent the gate material of the Vertical DMOS. If one wishes to use an approach compatible with CMOS, BiCMOS, or BCD, poly would be used as the gate material. This is to allow for subsequent high temperature diffusions for those approaches. In these approaches where slots are filled with poly one may process CMOS using the source/body diffusions for the P channel and N channel source/drains. For BiCMOS the source/body diffusions may be used as the emitters and bases of the Bipolar devices or one may process as separate entities. For BCD the source/body diffusions may be used or separate diffusions for the Bipolar and CMOS portions or separate diffusions done.

Voltage applied to the poly gates inverts the vertical walls of the P body, which is buried, thus connecting the N Source to the epitaxial and buried layer of the Vertical DMOS (see FIG. 6). Note that a voltage on the poly inverts a P body extension on all sides of the slot, thus giving a least two channels (vertical channels) per slot. It is capable of forming channels for 360 degrees around the slot. This structure is unique compared to the present approaches being used at Micrel and in the industry, in that, the channel is vertical rather than horizontal. Note the current path 308 shown in FIG. 6. This results in less communication with the surface with respect to the channel. It also results in current being carried vertically rather than the horizontal+vertical path of the normal Vertical DMOS. This approach therefore results in no JFET action to cause semi saturation (quasi-saturation) and a cleaner set of output functions; i.e., no quasi saturation portion when going from the linear portion to the saturation portion of the output curves.

Figure 1:
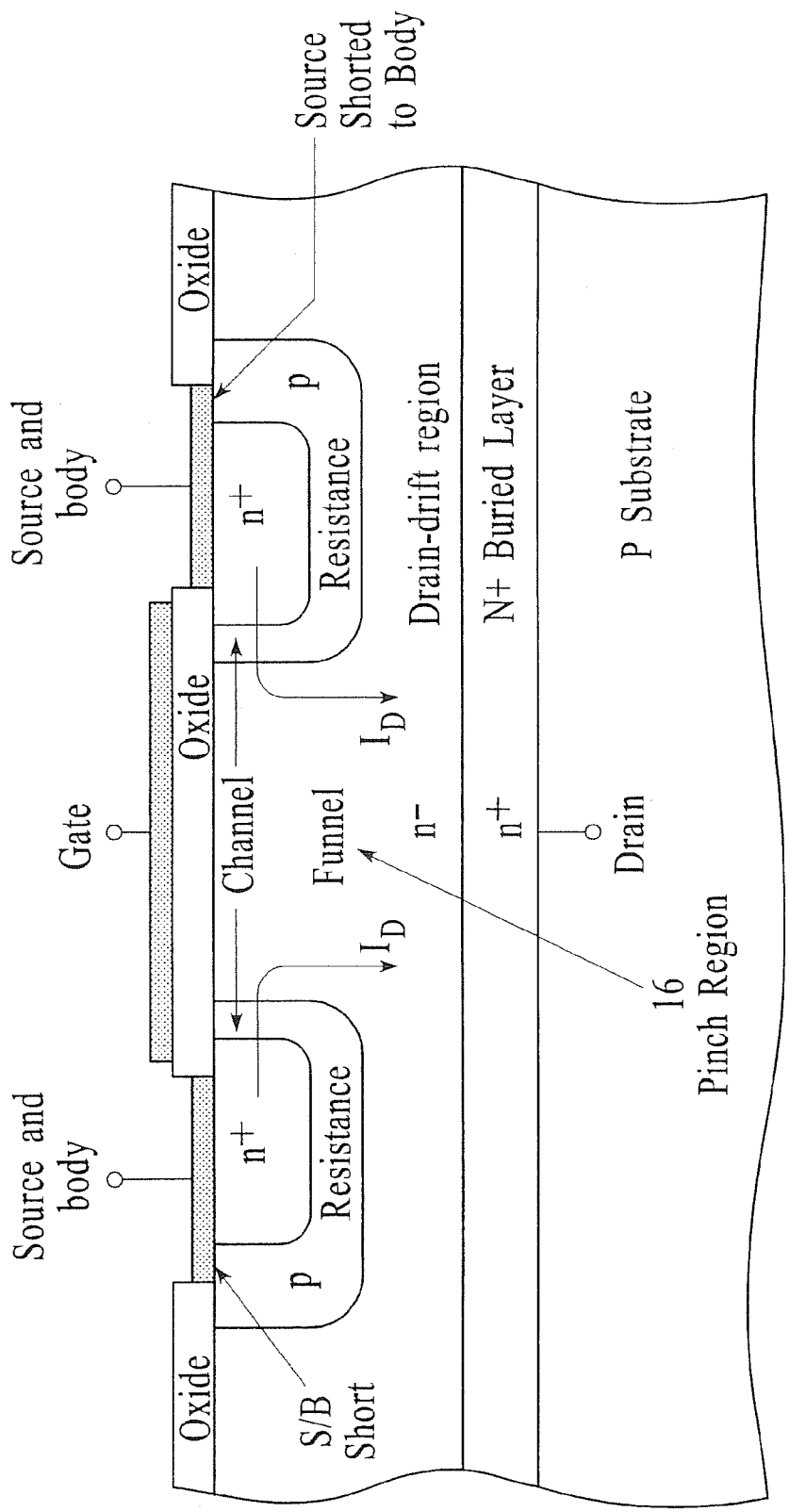
FIG. 1 illustrates a cross section view of a conventional Vertical DMOS (VDMOS) device.

The other thing that is unique is that the body no longer needs to be tied to ground. The only reason the body was tied to ground on previous structures was to cut the body off to prevent current flow that would result in NPN action and snap back voltage occurring. This can be seen in FIG. 1 where the section marked "resistance" is the portion of the body that is away from the active channel portion of the device. This is an extra body length away from the active channel and carries hole type current that is the result of impact ionization, and is undesired current. This current results in a voltage being developed in the body resistance and across the source/body junction to the grounded source. This voltage occurs at an elevated DRAIN voltage and Ids current level, resulting in forward biasing the source/body junction. This results in an NPN parasitic transistor from the source/body junction through the region marked "resistor" (shown in FIG. 1) to the epitaxial region—and the resulting snap back voltage is the LVCEO of the parasitic NPN transistor. This snap back is shown in FIG. 2 and limits the voltage and sustaining current of the device and therefore reduces its useful range of operation.

In the structure being described here, there is no extra body. It has been eliminated by design and results in NO bias build up and no snap back voltage. With this shorter structure, the channels formed vertically in the body on all sides of the slot short out the complete body.

This structure eliminates the requirement of an interconnect protruding into the array to short the source to body in the array. Since this is eliminated, there is no space required, thus leaving the array with tighter packing density. This structure, due to the elimination of the extra body length and elimination of the "resistor" portion reduces the active area size, reduces the input capacitance, increases the efficiency and results in a higher frequency device.

It is obvious that the packing density on this type of array is very high. It is only limited by the poly filled slot of 3 um and the area it takes up. Reduction of the slot "B" dimension to 2 um or much less will significantly reduce the array size even further without affecting the operation of the device. This slot can be reduced to 1 um since the poly thickness of 3500 A could easily conform to the sides and this would make for an even tighter array. With the equipment available today the slot dimensions are only limited by the manufacturer's resolution of critical dimensions they are able to resolve and the ability to provide even thinner poly where required in the slots.

The channel length of this device is not determined by a critical masking but is determined by the difference between the "N" diffusion of the source and the "P" diffusion of the body. This is the channel region that is inverted when voltage is applied between gate and ground. This of course could provide very short channels. If the spacing between slots (the active area, dimension D) were to be made 2 um, then any voltage on the poly gates would result in the inversion covering the total body. Channels coming in from all sides would meet resulting in complete activation of the total body regions. The path from source to epi/buried layer would be as wide as the distance between the slots leaving only N type material (after inversion) between the source and the N epitaxial. This would result in no P body material (as there are on present designs used in the industry) to ever cause a problem. At that point the whole array would be active except for the poly. This would result in a very efficient array and result in a very low Ron X area PowerFET. One that is able to carry high currents where required with lower IR drops than the standard methods used in the industry and higher operating voltages and currents.

Forming the Ground Strap, Buried Power Buss, Sinker and Drain

In proceeding directly to the metal structures of the device and eliminating discussion of the CMOS and BiPolar sections of the approach, it is assumed these steps are done as normal up to the contact and metal process and will not be discussed.

The metal process is different, in that, prior to metal, a few thin layers of dielectric are deposited and the places where metal is to be deposited are opened down to nitride. This is followed by a thick layer of TEOS that is approximately 9000

A thick. This is polished and provides a tapered (shallow trench isolation type) structure where the metal will enter the contact areas. Slots are now etched (approximately 3 um) where the ground strap, metal sinker and the power buss are located.

Figure 7:
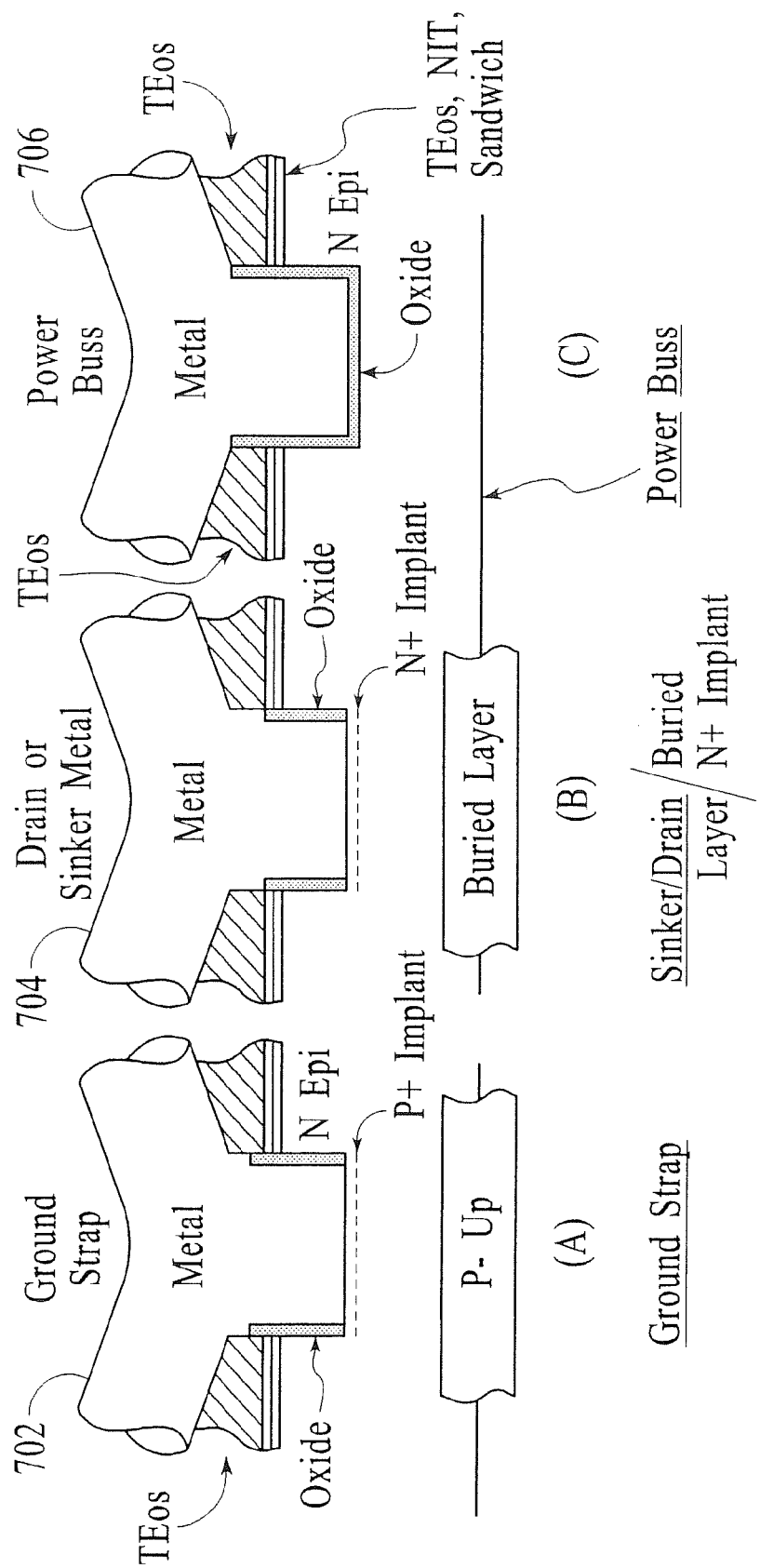
FIG. 7 illustrates the metal connecting to the ground strap, metal sinker, and the power buss and drain.

FIG. 7 shows the metal connecting to the ground strap 702, metal sinker 704, the power buss 700 and drain. This figure shows the tapered TEOS. (Details of how to obtain this structure are shown in a previous patent application in U.S. patent application Ser. No. 10/034,184, entitled "Buried Power Buss for High Current, High Power Semiconductor Devices and a Method for Providing the Same" and filed on Dec. 28, 2001. The ground strap makes its connection to the P substrate by way of the P up isolation diffusion, a P+ implant and anneal at the bottom of the ground strap slot and the metal contacting the P implant. In order to ensure good connection the Pwell implant and diffusion will be located at the bottom of the ground strap slots as shown in the A portion of FIG. 7. In applications requiring BiPolar, the body implant and diffusion may be substituted at the bottom of the slots that will be used for the ground strap. This would give a very solid ground which serves as the chip ground. Note that this approach results in oxide isolation from one active area to another or from an inactive area to another. This results in oxide isolation for the devices formed for CMOS, BiPolar, DMOS, or BCD. The long time, high temperature and area consuming isolation diffusion of a conventional process is eliminated.

The B portion of FIG. 7 shows how this process forms metal contacts for the sinker 704 to the buried layer for Bipolar devices, as well as drains of Vertical DMOS, or drains of CMOS devices to the buried layer N region. In these cases an N type implant is placed at the bottom of the slots that perform this function. This N+ implant can come as part of the process for forming other active areas in these devices or as a separate implant and anneal.

The C portion of FIG. 7 shows how the slots are handled for the buried power buss 706. In this case there is no need for an implant at the bottom of these slots since the buried power buss is surrounded by oxide that isolates it from unwanted areas.

Figure 8:
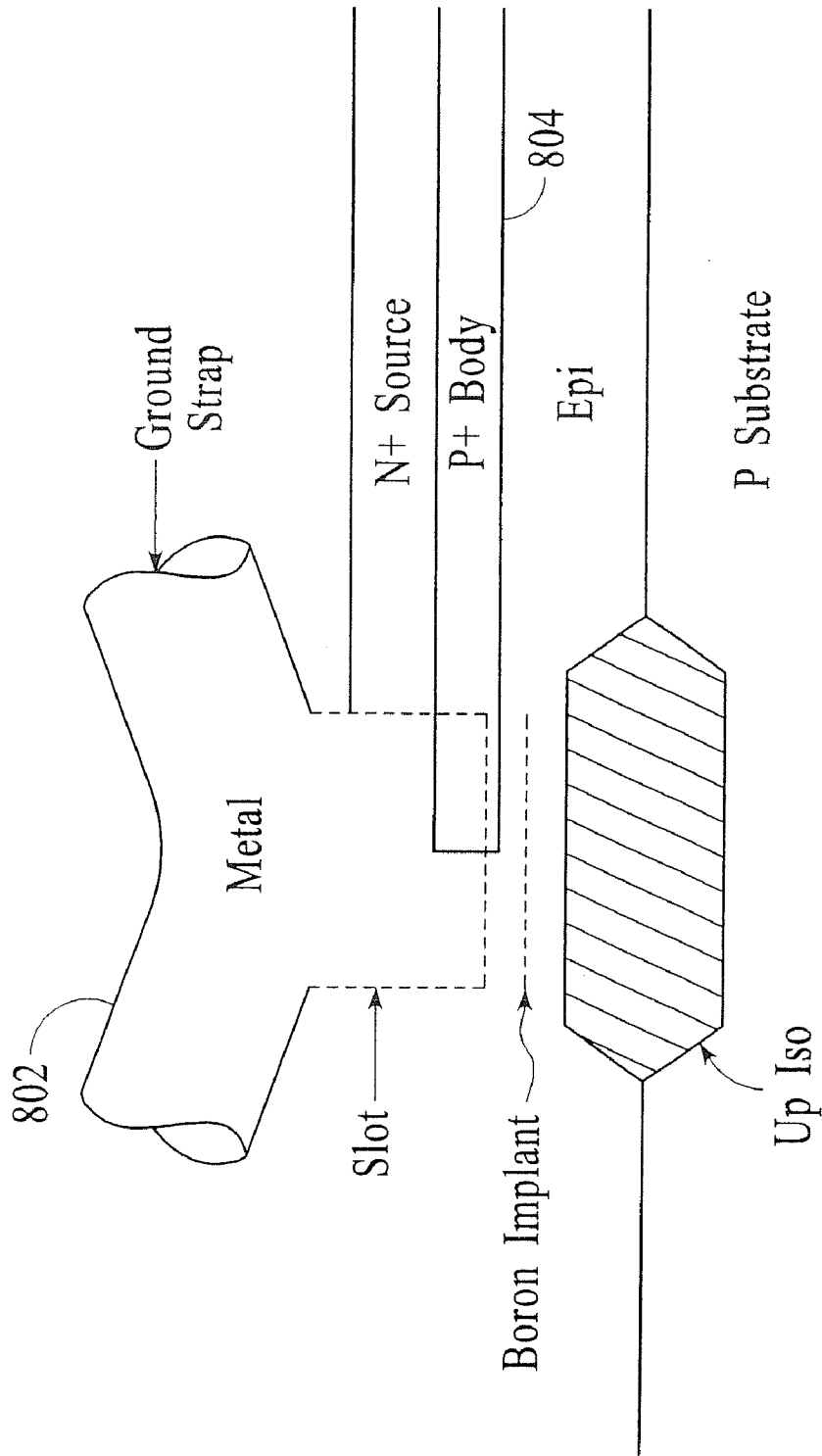
FIG. 8 illustrates a grounding strap tied to the edge of an array body to provide a ground for the body if required in an array of source/body areas used in a power FET.

FIG. 8 shows a grounding strap 802 tied to the edge of an array body 804 to provide a ground for the body if required in an array of source/body areas used in a power FET.

Figure 9A:
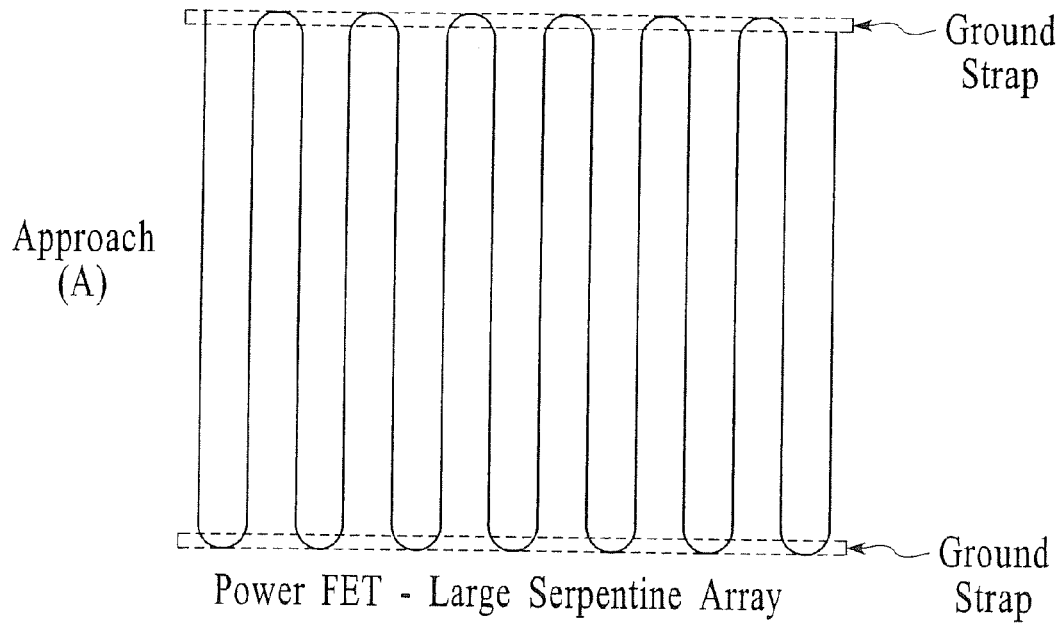
FIG. 9A illustrates a design laid out in a serpentine fashion.

FIG. 9A shows a design 902 laid out in a serpentine fashion. At the end of each stripe is the P type ground strap to tie that end to ground. The number of ground taps per "unit length" is determined by how short the lengths of source are made before making the serpentine turn and receiving the ground strap. In this manner there will be many of these ground straps to ensure the total Power FET and chip is at a common ground.

Figure 9B:
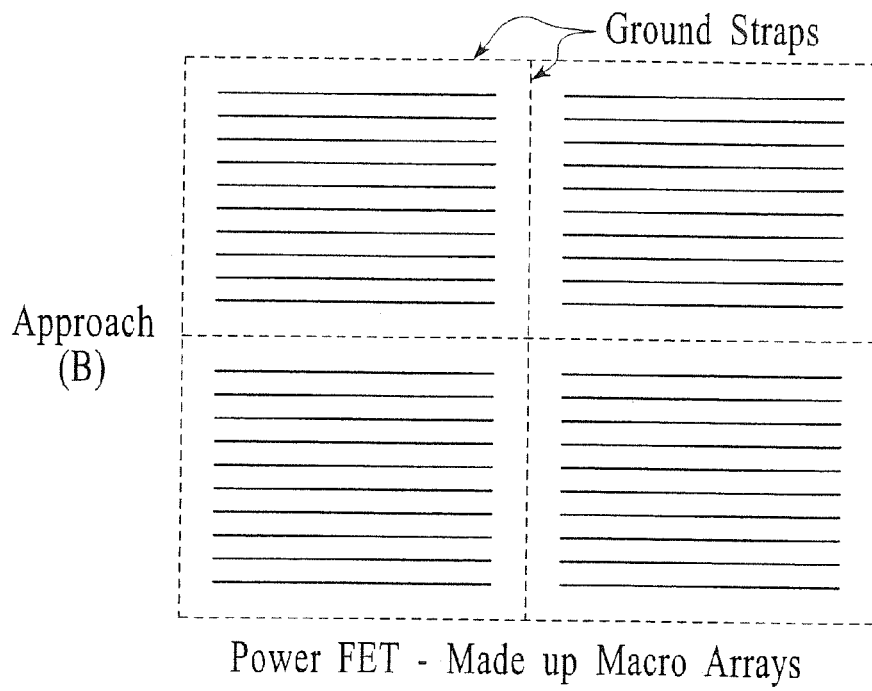
FIG. 9B illustrates an array of the large PowerFET design with macros.

Instead of one big serpentine design we can also make the array of the large PowerFET design 904 with macros as shown in FIG. 9B. This would result in the ground strap surrounding a given number of source stripes as shown in FIG. 9B. This results in a matrix of N serpentines each surrounded by the ground strap.

These metal busses perform several functions. The sinker metal results in (shown with an N type implant that was done just after the slot oxidation) a metal alloy into the silicon at the point where the sinker slots, implant N+ into the bottom of the slots and buried layer intersect to provide a low resistance portion. Since the epi is only 3 um to 7 um thick, depending on the voltage that needs to be supported, the buried layer comes up about 2-3 um and the slot implant anneal almost connects the two. This is followed by a metal that is alloyed giving a low resistance metal sinker portion and reduces the Power-FET's resistance.

The buried power buss approach results in a structure that is a low profile and provides two layers of metal, thus eliminating a need for a second metal. Since the metal is 3.0 to 6.0 um thick, it can carry the high current at the first level of metal. Half of this thickness of metal is all that needs patterning thus eliminating the need for thick metal etching. Since the first deposition is buried in these slots they offer no steps for the second deposition to cross over. This is a major advantage of this approach.

Standard approaches cannot have two thick metals since the step over the first metal will result in the second metal breaking over these steps. With this approach one obtains two thick levels of metal with only one level (the last and thinner one) being patterned by the standard "resist-patterning-etch process, and this second metal does not go over high steps since the first metal is buried in the slots.

Standard approaches require both layers of metal to go through this procedure. Because of this limitation the standard approach uses a thin first layer of metal that is patterned. This is followed by dielectrics, via openings, and a second thick metal which is patterned. This results in the first metal carrying very little current and the second metal carrying the high current. With the approach discussed here, the first deposition is thick metal and carries the high current. The second deposition (as opposed to a complete second metal in the standard approach) is the patterned metal and can be thin and easily routed. Where desired, the thinner metal contacts the thick first layer and results in an even thicker metal. The combination of the two depositions results in a very thick metal capable of carrying even heavier current than the first deposition and more current than any other approach using the same amount of surface area. This approach also eliminates the deposition of a dielectric and the patterning of the vias that occur in the standard dual metal approach. The ground strap is also a "buried structure" and allows grounding to be located at many places in the chip thus allowing additional metal layers if necessary without offering a large step this additional metal to pass over. In cases where we think it is wise we can have the ground strap contact an edge of the serpentine body. This is easily accomplished by having spots where there are no source diffusions covering the body diffusions at the grounding points. This will allow the ground strap to hit both the source edge and the body directly (see FIG. 8).

Another advantage of the metal being in a slot relates to a means of eventually providing thicker metal while only having to deposit half that amount. This is done by taking advantage of the fact that you can "fold" the metal in the slots. With a 3 um slot depth and width, one could deposit 1.5 um of metal and have the slots look like 3 um of metal thickness. This would give the grounds, sinkers, and power busses significant metal thickness without needing to deposit or etch thick metal. Eventually one could have 5 um metal slots that would allow 2.5 um of metal deposition resulting in 5 micron thick metal busses for ground and power. This is accomplished by having metal that is conformal. This can be obtained using CVD metal deposition. Another approach is to have metal deposited over the entire wafer followed by resist application and planar etching the resist and the metal in the field, or CMP removal of to remove metal in the field while leaving the metal in the slots. The second deposition results in metal in the slots being very thick and the metal in the field much thinner and this is the metal that is patterned for the interconnects. To provide a structure with sloped metal entering the metal area, I have placed the 9000 A of TEOS process at the beginning of the metalization process. After polishing it leaves a sloped entrance into these metal slot areas as shown in FIG. 7.

This approach is very robust for the Vertical DMOS relative to:

Punch through voltage—body concentration gradient results in depletion extending into the epitaxial area rather than the body.

Reach through voltage—distance between body and epitaxial material can be made ample to prevent reach through.

Breakdown voltage and the planar breakdown of the epi to body would be high.

Snap back voltage—The elimination of the extra body length results in snap back being relegated to a non entity. See FIG. 3 that shows the ideal breakdown structure having a very slight snap back.

Structure can be very robust relative to current carrying capability.

Area of Concern

An area of concern is the voltage across the gate oxide. In the classical vertical DMOS, voltage on the gate oxide is protected by the depletion from the body areas reaching across the current funnel area and thus not allowing high voltage to appear across the gate oxide. Since the design discussed here results in vertical flow of the current and no pinching off of the "funnel" and no JFET actions (all of which have their very good points), it does not have this protection. Considering this, three approaches were reviewed to determine the optimum slot depth relative to the source/body to reduce the voltage across the gate oxide in these slots. These are shown in FIG. 10. It is assumed the source/body could be located in one of the three positions as shown in FIGS. 10A, 10B and 10C. This shows the body above the poly slot (FIG. 10A), even with the poly slot (FIG. 10B) and below the poly slot (FIG. 10C). Realizing that the oxide at the bottom of the slot, which is also gate oxide, would have the supply voltage across it; an implant is made below the slot as shown in FIGS. 10A, 10B and FIG. 10C. This at least protects the bottom of the slot. Any voltage applied between the gate and the drain would show up across the depletion of this P+/epi implant and the oxide, with most of it appearing across the depleted region. This will protect the bottom of the slots from oxide TDDB issues. This leaves the gate oxide in these three cases protected relative to the bottom of the slot from TDDB issues and field inversion issues.

Now let's look at the sides of the slot where the P body interfaces with the vertical gate oxide. Case FIG. 10B—where the slot and body end at the same location, will not have a problem. This case has the bottom of the P+ body protecting the gate oxide on the side of the poly slot and voltage on the drain will deplete it partially and the voltage on the poly gate will finish the job. In case FIG. 10C this will operate just as case FIG. 10B, resulting in the side oxide having the body next to it and shielding the gate oxide. One might think that this case would be an issue since the side gate does not cover the body completely and you might not be able to turn it on. However, there are three reasons it will work:

1. Any voltage on the drain will deplete the bottom of the slot and the side of the slot and make it easy for the gate to complete the inversion.

2. Without any drain voltage, when voltage is applied to the gate it will invert the body on the sides and invert the body below the slot. In this case we would have a "channel", not only on the sides of the slot, but along the bottom and connecting the adjacent body. This would mean we have a continuous channel across the whole bottom of the array and possible a lower Ron X area.

3. With both the gate voltage and drain voltage on, we would have normal operation. In this case the amount of body extending below the slot would be less than a tenth of a micron.

In case FIG. 10A, for switching applications, with the gate shorted to ground, the total drain voltage will appear across the oxide on the sides of the poly slot not covered by P body and may be a limiting issue.

With voltage on the gate there will be current flowing and the voltage across the gate oxide on these sides will be the supply voltage minus any voltage drop in the circuit load, minus any voltage drop in the collector, minus the voltage of the gate. If the supply voltage was 40 volts and the gate voltage was 10 volts, this would probably result in the voltage across this oxide to be about equal to the Ron voltage drop across the PowerFET. This could be very low voltage when used in switching applications and not cause any problems. So, in switching applications type FIG. 10A could only be used for low voltage applications—because of the conditions that would prevail with the gate grounded.

Therefore it is recommended that the process be done with the body even or slightly below the slot depth as shown in FIGS. 10B and 10C. With this in place the gate oxide should be able to operate at the high voltages presently being supplied by our standard approach.

Unique Approach Using Metal as the Gate Instead of Poly

If metal were used in the slots instead of poly it would restrict processing of the gate using this metal in any early steps in a process where high temperatures would follow. However, it is possible to do the slots and metalization as the last major steps in the processing. In these cases all the diffusions would be done and in place prior to providing the slots. The slots would then be oxidized and implants completed and annealed where needed in the bottom of slots as previously discussed. These slots and their oxide would be used to form metal gates in place of the poly previously discussed for the vertical DMOS. This approach has some advantages relative to the cost for producing this function. One does not need to provide the poly and all the extra processes related to a poly structure. Using the metal gate approach results in less masking steps as well as several major processing steps being eliminated. The combination of eliminating the isolation process, the sinker and drain diffusions, the poly gate process and all it associated steps, and going directed to the metal gate process using the buried power buss process with its dual metal without the dual metal processing, results in a very cost effective approach for a Power FET and other integrated functions.

Figure 11:
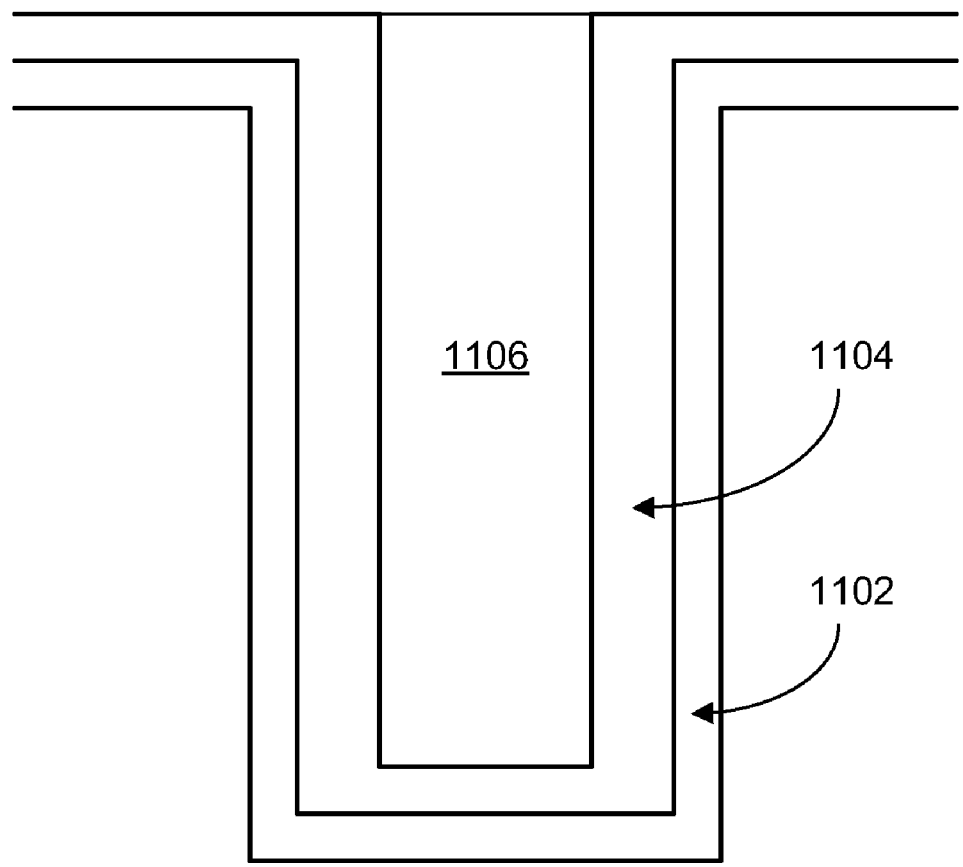
FIG. 11 illustrates a slot partially filled with metal, according to one embodiment of the present invention.

FIG. 11 illustrates a slot 1100 (or trench-gate, vertical DMOS) partially filled with metal, according to one embodiment of the present invention. The slot includes a gate oxide layer 1102, a polysilicon layer 1104, and a metal layer 1106. In one example, dimensions of the slot are 1.2 micron wide and 3 micron high, the gate oxide layer 1102 is 500 angstrom thick, the polysilicon layer is 2,500 angstrom thick, and the metal layer is 6,000 angstrom thick. Alternative dimensions, and relative proportions of the layers are possible within the spirit of the present invention.

In one embodiment, the metal layer 1106 comprises tungsten to plug the slot 1100. Tungsten is particularly amenable to insertion using a chemical vapor deposition (CVD) process that may not be possible with other types of metals. Once inserted, excess metal can be removed from the top using a chemical mechanical polishing (CMP) process or a plasma etch technique. Additionally, tugsten has low resistance, and is already used for other metal components in transistors such as contacts and vias.

The polysilicon layer 1104 protects the gate oxide layer 1102 from the metal layer 1106 in providing a pristine connection. Additionally, the polysilicon layer 110 provides an optimal work function value for an appropriate threshold vertical DMOS. More specifically, work function is the first term (i.e., ϕms) of the Threshold Equation known as V(2ϕf)=ϕms+2ϕf−[Qf/Cs+QB/Cs]. In one embodiment, the polysilicon is inserted with a low pressure CVD process (LPCVD).

The gate oxide layer 1102 interfaces with the input voltage. The gate oxide layer 1102 can be composed of silicon dioxide (SiO2), oxynitride, or the like.

This Process Eliminates:

The space taken up by the body in the large Power FET array

Ground strapping from the body to the source as we know it.

No ground leads into the array.

Highest current for the same surface area consumed.

The sinker process, even though it provides a very good one.

The isolation masking and processing.

The quasi saturation part of the output characteristics. Eliminates the FET type pinching that a vertical DMOS has.

Snap back voltage (sustaining voltage) is eliminated

While Providing:

A buried, gated channel

An array that is very small for the power output

Double channeling for every source drain (Low Ron)

Process capable of high voltages and high currents

No snap back voltage and is not limited by sustaining current

A power buss that provides thick and wide metal while only depositing 1.5-2.0 um of metal for the interconnect to be masked and etched.

A fairly simple and straightforward process that should take less than 15 masking steps in most cases.

Dual metal with single metal processing and simple bussing.

Thick metal to provide low resistance, low loss, excellent heat transfer, extended current before being limited by electro-migration and only requires thin metal processing and etching.

Very low ground resistance

Only high temperature processing after EPI is the deep Pwell that is done prior to most other steps and therefore this turns out to be a low temperature, well controlled process.

Low capacitance, high frequency of operation.

Inexpensive alternative approach of using a metal gate structure.

CONCLUSION

All aspects of this approach provide a device with many excellent characteristics. Other than the possible oxide issue discussed for the 10 A approach, this design results in higher voltage applications, higher current applications and an Ron X area that would appear to be as small as any currently in existence.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A vertical DMOS device comprising:
    a semiconductor substrate, the semiconductor substrate including a source/body structure thereon; and
    a plurality of interconnects through the source/body structure, each of the plurality of interconnects comprising one slot provided in the semiconductor substrate and at least one metal within the slot to form a plurality of structures, wherein a broad use, high voltage, and high current device is provided, wherein the source/body structure is not grounded and wherein a plurality of ground straps are provided at each end of source stripes laid out in a serpentine fashion to ensure that the device is at a common ground, the plurality of ground straps also forming a matrix of macro arrays, each macro array including a source stripe laid out in a serpentine fashion,
    wherein the slot includes a layer of gate oxide and the at least one metal along with a layer of polysilicon between the gate oxide and the at least one metal.

2. The vertical DMOS device of claim 1 wherein the semiconductor substrate comprises:
    a substrate region; and
    a buried layer, or Boron Up Diffusion where required and an epitaxial (EPI) layer over the substrate region, wherein the source/body structures are provided in the EPI layer.

3. The vertical DMOS device of claim 1 wherein the source/body structure is continuous.

4. The vertical DMOS device of claim 3 wherein the plurality of interconnects comprise any of a ground strap metal sinker.

5. The vertical DMOS device of claim 4 wherein the channel is vertical.

6. The vertical DMOS device of claim 4 wherein the array comprises a tight packing density.

7. The vertical DMOS device of claim 4 wherein the channels are short because they are determined by the difference between the junctions of source/body structure and the body/EPI when fully inverted.

8. A vertical DMOS device comprising:
    (a) a semiconductor substrate with a source/body structure thereon;
    (b) a plurality of oxidized slots in the source/body structure; and
    (c) a metal within the plurality of slots to form a plurality of structures, wherein a broad use, high voltage and high current device is provided, wherein the source/body structure is not grounded wherein a ground strap is provided as one of plurality of structures and is designed as macros of metal busses, wherein the slot includes a layer of gate oxide and the at least one metal along with a layer of polysilicon between the gate oxide and the at least one.

9. The device of claim 8, wherein the source/body structure is continuous.

10. The device of claim 8, wherein the channel is vertical.

11. The device of claim 8, wherein the array comprises a tight packing density.

12. The device of claim 8, wherein the channels are short because they are determined by the difference between the junctions of source/body structure and the substrate when fully inverted.

* * * * *